United States Patent
Ohshima

(10) Patent No.: US 8,351,175 B2
(45) Date of Patent: Jan. 8, 2013

(54) PROTECTIVE DEVICE FOR LOAD CIRCUIT

(75) Inventor: Shunzou Ohshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 296 days.

(21) Appl. No.: 12/935,097

(22) PCT Filed: Aug. 26, 2009

(86) PCT No.: PCT/JP2009/064875
§ 371 (c)(1),
(2), (4) Date: Sep. 28, 2010

(87) PCT Pub. No.: WO2010/024296
PCT Pub. Date: Mar. 4, 2010

(65) Prior Publication Data
US 2011/0019323 A1    Jan. 27, 2011

(30) Foreign Application Priority Data
Aug. 26, 2008 (JP) ................. 2008-216388

(51) Int. Cl.
*H02H 3/08* (2006.01)
(52) U.S. Cl. .................................. 361/93.1
(58) Field of Classification Search ............ None
See application file for complete search history.

(56) References Cited

U.S. PATENT DOCUMENTS

| | | | |
|---|---|---|---|
| 5,783,915 A * | 7/1998 | Shida et al. | 318/135 |
| 7,030,582 B2 * | 4/2006 | Masino | 318/400.26 |
| 2004/0207967 A1 | 10/2004 | Ohshima | |
| 2005/0286200 A1 | 12/2005 | Ohshima | |
| 2006/0007626 A1 | 1/2006 | Ohshima | |
| 2007/0064368 A1 | 3/2007 | Ohshima | |

FOREIGN PATENT DOCUMENTS

| | | |
|---|---|---|
| JP | 2002-353794 A | 12/2002 |
| JP | 2006-5581 A | 1/2006 |
| JP | 2006-24997 A | 1/2006 |
| JP | 2007-85861 A | 4/2007 |

OTHER PUBLICATIONS

International Search Report [PCT/ISA/210] issued Sep. 29, 2009, in PCT/JP2009/064875.

* cited by examiner

Primary Examiner — Stephen W Jackson
Assistant Examiner — Terrence Willoughby
(74) Attorney, Agent, or Firm — Sughrue Mion, PLLC

(57) ABSTRACT

A protective device for a load circuit that instantly cuts off the load circuit when a dead short-circuit has occurred in the load circuit. The protective device includes a first detection circuit which detects a counter-electromotive force E1 induced in a common wiring line for connecting a plurality of load circuits and a power source, and a second detection circuit which detects a counter-electromotive force E2 induced at part of a load connection wiring line for connecting the individual load circuits. The load circuit is cut off when the first detection circuit detects that the counter-electromotive force E1 induced in the common wiring line has exceeded a predetermined value, and the second detection circuit detects that the counter-electromotive force E2 that has the same direction as that of E1 has been generated in the load connection wiring line.

3 Claims, 4 Drawing Sheets

PROTECTIVE DEVICE FOR LOAD CIRCUIT

TECHNICAL FIELD

The present invention relates to a protective device for a load circuit in the case where a plurality of loops of load circuits are connected to an identical power source and where a short-circuit fault has occurred in any of the load circuits, the protective device cutting off and protecting only the load circuit in which the short-circuit fault has occurred.

BACKGROUND ART

Loads, for example, a lamp and a motor that are mounted on a vehicle are connected with a power source (battery) through semiconductor switches. More specifically, load circuits in which the semiconductor switches and the loads are connected in series are connected as a plurality of loops to the power source which is mounted on the vehicle, and the drive and stop of the individual loads are controlled by ON/OFF-manipulating the semiconductor switches which are disposed in the individual load circuits.

Besides, a protective device is disposed in order that, in a case where an over-current ascribable to a short-circuit fault such as a dead short-circuit has flowed in any of the individual load circuits, the load circuit may be protected by turning OFF the semiconductor switch as soon as possible. As prior-art examples of such a protective device for the load circuit, there have been known ones stated in, for example, Japanese JP-A-2006-24997 (Patent Document 1) and Japanese JP-A-2007-85861 (Patent Document 2).

FIG. 4 is a circuit diagram showing the configuration of the protective device for the load circuit as is stated in Patent Document 1. In the circuit shown in FIG. 4, there is illustrated an example in which two loops of load circuits (first load circuit "A" and second load circuit "B") are connected in parallel to a power source VB. More specifically, the first load circuit "A" which includes a series connection consisting of a MOSFET (T101; semiconductor switch) and a load 111 (a lamp, a motor, or the like), and the second load circuit "B" which includes a series connection consisting of a MOSFET (T101-1) and a load 111-1 are connected to the power source VB. Incidentally, since the first load circuit "A" and the second load circuit "B" are identical in configuration, only the first load circuit "A" will be described below, and the second load circuit "B" shall be omitted from description by assigning a suffix "−1" thereto.

In the circuit shown in FIG. 4, a point P1 that corresponds to the drain of the MOSFET (T101) is connected to an E1 detection circuit 112. The E1 detection circuit 112 is disposed in common for the load circuits "A" and "B". It detects a counter-electromotive force E1 which is generated in the wiring line (resistance Rw1 and inductance L1) between the point P1 and the plus terminal of the power source PB, and it outputs the detection signal of an H level to one input terminal of an AND circuit AND102 in a case where the counter-electromotive force E1 has reached a predetermined level.

Both the ends of the MOSFET (T101) are connected to a VDS detection circuit 113. This VDS detection circuit 113 measures the terminal voltage of the MOSFET (T101), and it outputs the detection signal of the H level to the other input terminal of the AND circuit AND102 in a case where the terminal voltage has reached a predetermined value.

In addition, when a switch SW101 which is interposed between the power source VB and a resistance R106 is turned ON, a drive command is input to a driver 114 through an AND circuit AND101, and upon receiving the drive command, the driver 114 outputs the drive signal of the H level to the gate of the MOSFET (T101). Thus, the MOSFET (T101) is turned ON, and the load 111 is driven.

Besides, in a case where a short-circuit fault such as a dead short-circuit has occurred in any place of the load circuit "A", an excess counter-electromotive force E1 is generated, and the terminal voltage of the MOSFET (T101) exceeds the predetermined value. Therefore, the output signal of the AND circuit AND102 becomes the H level, and the H level signal is fed to a latch DF101. As a result, the output of the AND circuit AND101 is brought to an L level, and a MOSFET (T103) is turned ON, whereby the gate of the MOSFET (T101) is grounded to cut off the load circuit "A". That is, the load circuit "A" in which the short-circuit fault has occurred is cut off, and the circuit is protected.

On this occasion, in the load circuit "B", the drive state thereof can be maintained irrespective of the cutoff of the load circuit "A". That is, in the circuit shown in FIG. 4, among the plurality of loops of load circuits, only the load circuit having undergone the short-circuit fault is cut off, and any other load circuit can be operated as usual.

PRIOR-ART DOCUMENTS

Patent Document

Patent Document 1: Japanese JP-A-2006-24997
Patent Document 2: Japanese JP-A-2007-85861

SUMMARY OF THE INVENTION

Problem that the Invention is to Solve

With the above prior-art example disclosed in Patent Document 1, however, in the case where the dead short-circuit has occurred in the load circuit "A", a long time is required before the voltage arising across the MOSFET (T101) exceeds the predetermined value, though the generation of the counter-electromotive force E1 is instantly detected by the E1 detection circuit 112. Therefore, the long time is required before the output signal of the VDS detection circuit 113 becomes the H level, resulting in the disadvantage that the turn-OFF of the MOSFET (T101) delays.

The present invention has been made in order to solve such a problem of the prior art, and it has for its object to provide a protective device for a load circuit as protects the load circuit by instantly cutting off only the load circuit in a case where a dead short-circuit has occurred in this load circuit.

Means for Solving the Problem

In order to accomplish the above object, the first aspect of the present invention consists in a protective device for a load circuit, in which a plurality of load circuits in each of which a semiconductor switch and a load are connected through a load connection wiring line are connected in parallel, each of the load circuits and a power source are connected through a common wiring line that is common to all the load circuits, and when an over-current has been generated in at least one of the load circuits, the load circuit having undergone the over-current is cut off; the protective device comprising a first counter-electromotive force detection unit for detecting a first counter-electromotive force which appears in the common wiring line, and a second counter-electromotive force detection unit disposed in at least one of the load circuits, and for detecting whether or not a second counter-electromotive force which is same direction as the first counter-electromotive force is induced in the load connection wiring line; and a cutoff control unit for cutting off the load circuit which has the load connection wiring line, in a case where the first counter-electromotive force has exceeded a predetermined threshold value and where the second counter-electromotive force has been induced in the load connection wiring line.

The second aspect of the present invention is wherein the load connection wiring line in the first aspect of the present invention is a wiring line which is used between a branch point branching from the common wiring line to each of the load circuits and a ground point for grounding each of individual load circuit; and said second counter-electromotive force detection unit in the first aspect of the invention detects a counter-electromotive force that is caused by an inductance component existent at part of the load connection wiring line.

The third aspect of the present invention consists in a protective device for a load circuit, in which a plurality of load circuits in each of which a semiconductor switch and a load are connected through a load connection wiring line are connected in parallel, each of the load circuits and a power source are connected through a common wiring line which is common to each of the load circuits, and when an over-current has been generated in at least one of the load circuits, the load circuit having undergone the over-current is cut off; the protective device comprising a first counter-electromotive force detection unit detecting a first counter-electromotive force which appears in the common wiring line; and a cutoff control unit disposed in at least one of the load circuits, for cutting off the load circuit which has the load connection wiring line, in a case where a portion of the load circuit which consists of the semiconductor switch and a part of the load connection wiring line has been set, where a voltage drop which appears across the portion of the load circuit has been measured, and where the first counter-electromotive force has exceeded a predetermined threshold value, while the voltage drop across the portion of the load circuit has exceeded a predetermined decision value.

ADVANTAGES OF THE INVENTION

With a protective device for a load circuit according to the present invention, a decision on whether or not a first counter-electromotive force E1 generated in a common wiring line (the wiring line between a point P1 and VB) has exceeded a predetermined value can be made the moment a short-circuit has been started by first counter-electromotive force detection unit, and also the subsequent identification of the load circuit having undergone the short-circuit can be made in a very short time, so that a time period which is expended from the occurrence of the short-circuit till the cutoff of the load circuit can be made shorter than in the prior art.

Therefore, a power loss which is generated by the flow of a short-circuit current through a semiconductor switch and a wiring line, and heat production which is attendant on the power loss, can be suppressed, and the performance of protecting a wiring system, especially the performance of protecting the semiconductor switch, is enhanced. Besides, the phenomenon that the counter-electromotive force E1 which is generated in the common wiring line exceeds the predetermined value is a peculiar phenomenon which takes place when short-circuit grounding has occurred in the load connection wiring line of any load circuit, and it does not occur due to any other cause, so that an erroneous decision is not apprehended even when a decision time period is set short.

Accordingly, the protective device for the load circuit as has a high reliability in spite of fast cutoff can be realized by the present invention.

MODE FOR CARRYING OUT THE INVENTION

First Embodiment

Figure 1:
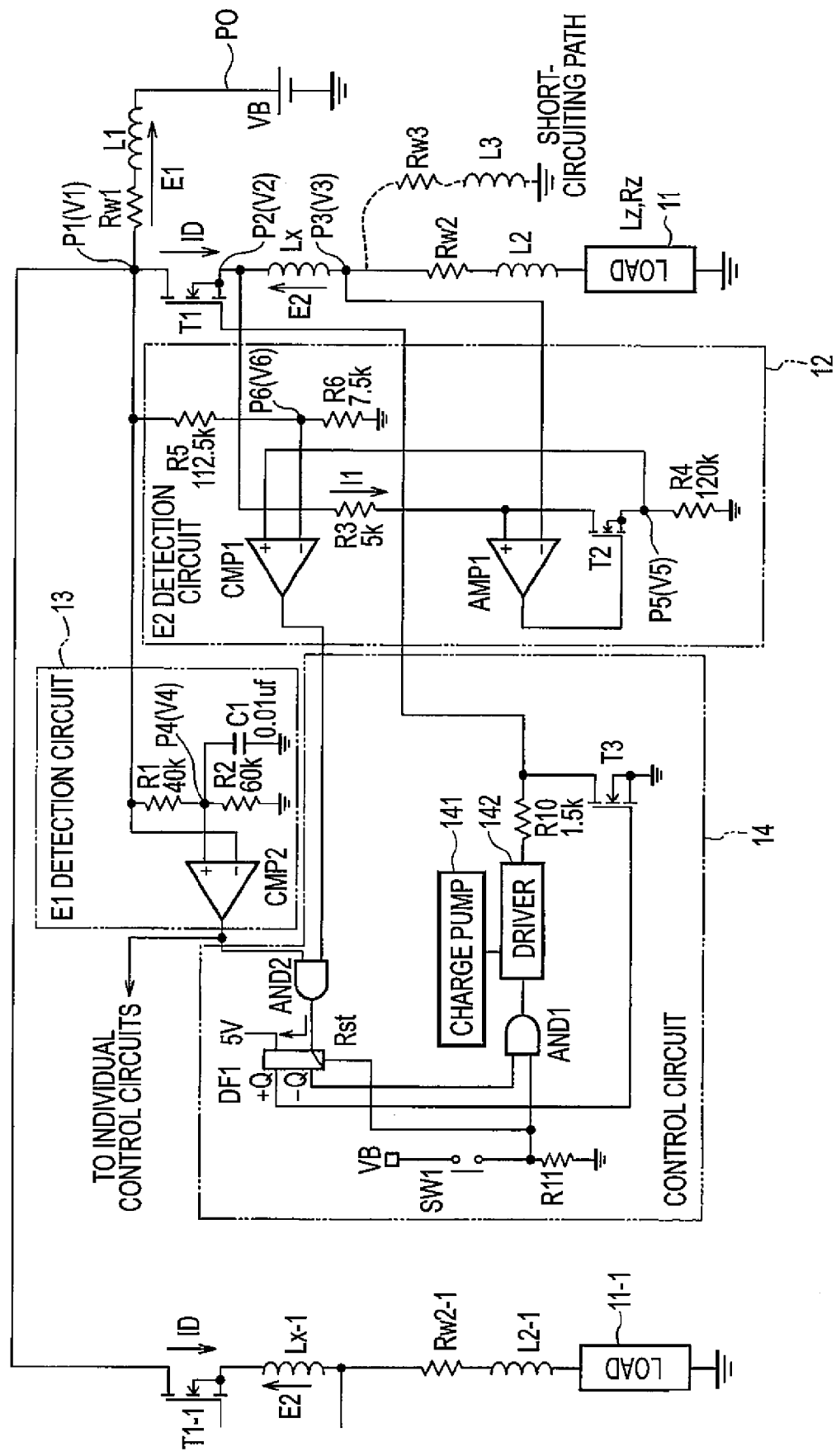
FIG. 1 is a circuit diagram showing the configuration of a protective device for a load circuit according to the first embodiment of the present invention.

Now, embodiments of the present invention will be described in conjunction with the drawings. FIG. 1 is a circuit diagram showing the configuration of a protective device for a load circuit according to the first embodiment of the present invention. The load circuit illustrated in the figure is a circuit for driving a load 11 (resistance Rz and inductance Lz), for example, a lamp or a motor that is mounted on a vehicle, and it includes a series connection circuit that consists of a MOSFET (T1; semiconductor switch) and the load 11. In addition, such load circuits are disposed as a plurality of loops (only two loops are illustrated in the figure), and a point P1 which is the coupling point of the individual load circuits is connected to the plus terminal of a power source VB through a wiring line (hereinbelow, termed the "common wiring line") having a resistance Rw1 and an inductance L1.

Besides, the point P1 is connected to an E1 detection circuit 13 (first counter-electromotive force detection unit), the gate of the MOSFET (T1) is connected to a control circuit 14 (cutoff control unit), and a point P2 which corresponds to the source of the MOSFET (T1), and a point P3 which is set midway of a wiring line (hereinbelow, termed the "load connection wiring line") for connecting the MOSFET (T1) and the load 11, are respectively connected to an E2 detection circuit 12 (second counter-electromotive force detection unit). Here, an inductance exists in the load connection wiring line between the points P2 and P3, and this inductance is denoted by Lx. Besides, the resistance and inductance of the load connection wiring line between the point P3 and the load 11 are, respectively denoted by Rw2 and L2.

The control circuit 14 includes a switch SW1, a charge pump 141, a driver 142, a latch circuit DF1, a MOSFET (T3), etc. One end of the switch SW1 is connected to the power source VB, while the other end thereof is branched into two loops. Of the two loops, one branch line is grounded through a resistance R11, and the other branch line is connected to one input terminal of an AND circuit AND1. Besides, the other input terminal of the AND circuit AND1 is connected to the –Q output of the latch DF1.

The output terminal of the AND circuit AND1 is connected to the driver 142, which is connected with the charge pump 141, and further, the output terminal of which is connected to the gate of the MOSFET (T1) through a resistance R10. In addition, in a case where the output signal of the AND circuit AND1 has become an H level, the driver 142 outputs a drive signal which becomes a voltage higher than the power source voltage VB, to the gate of the MOSFET (T1), thereby to turn ON the MOSFET (T1).

One end of the resistance R10 is grounded through the MOSFET (T3), and the gate of the MOSFET (T3) is connected to the +Q output of the latch DF1. Besides, the output terminal of an AND circuit AND2 is connected to the latch DF1. Incidentally, numerical values that are indicated under the symbols of resistances and a capacitor in the figure indicate the concrete values of these elements. By way of example, the resistance value of the resistance R10 is 1.5 [kΩ] as an example.

One E1 detection circuit 13 is disposed for the plurality of load circuits, it includes a comparator CMP2, and the inverting input terminal of the comparator CMP2 is connected to the point P1. Besides, the E1 detection circuit 13 includes a series connection circuit consisting of resistances R1 and R2, the series connection circuit is interposed between the point P1 and the ground, and a point P4 (voltage V4) which is the node between the resistances R1 and R2 is connected to the non-inverting input terminal of the comparator CMP2. Further, the point P4 is grounded through a capacitor C1. The output terminal of the comparator CMP2 is connected to one input terminal of the AND circuit AND2. Incidentally, the output terminal of the comparator CMP2 is branched into the plurality of loops, and it is connected to the AND circuits AND2 disposed in each of the load circuits.

The E2 detection circuit 12 monitors a voltage appearing between the points P2 and P3, thereby to decide whether or not a counter-electromotive force E2 in the same direction as that of a counter-electromotive force E1 has been generated in the load circuit. It includes an amplifier AMP1, a comparator CMP1, a MOSFET (T2), and resistances R3, R4, R5 and R6.

The point P2 (voltage V2) which corresponds to the source of the MOSFET (T1) is grounded through a series connection circuit consisting of the resistance R3, the MOSFET (T2) and the resistance R4, and the node between the resistance R3 and the MOSFET (T2) is connected to the non-inverting input terminal of the amplifier AMP1. Besides, the point P3 is connected to the inverting input terminal of the amplifier AMP1, and the output terminal of this amplifier AMP1 is connected to the gate of the MOSFET (T2).

Further, a point P5 that corresponds to the source of the MOSFET (T2) is connected to the non-inverting input terminal of the comparator CMP1. Besides, a series connection circuit consisting of the resistances R5 and R6 is interposed between the point P1 and the ground, and a point P6 (voltage V6) that is the node between the resistances R5 and R6 is connected to the inverting input terminal of the comparator CMP1. The voltage V6 is used as a decision voltage (a predetermined decision value) for deciding whether or not the counter-electromotive force E2 has been generated.

Besides, although omitted from illustration, the control circuit 14 and the E2 detection circuit 12 stated above are included also in a load circuit that includes a MOSFET (T1-1) and a load 11-1 shown in FIG. 1.

Description of Operation of First Embodiment

Next, the operation of the above protective device for the load circuit will be described. When the switch SW1 is turned ON, an H level signal is input to one input terminal of the AND circuit AND1, and besides, the −Q output of the latch DF1 is at the H level, so that the output of the AND circuit AND1 becomes the H level, which is fed to the driver 142. Thus, a voltage output from the charge pump 141 is applied to the driver 142, and this driver 142 outputs a voltage which is about 10 to 14 [V] higher than the output voltage of the power source VB, to the gate of the MOSFET (T1), so that this MOSFET (T1) is turned ON, to drive the load 11.

On condition that any abnormality is not existent in the wiring line and that the load 11 is normally driven, if a current flowing in the sense of P2→P3 increases, the counter-electromotive force E2 is generated in the sense of an arrow in the figure, and if the current flowing in the sense of P2→P3 decreases, the counter-electromotive force E2 is generated in a sense opposite to the sense of the arrow in the figure. If the current flowing in the sense of P2→P3 does not change, the counter-electromotive force E2 is zero. The counter-electromotive force E2 is generated in the sense of the arrow in the figure when any abnormality is not existent in the wiring line and when a voltage V5 obtained by amplifying the counter-electromotive force E2 has exceeded V6 being the decision voltage of the counter-electromotive force E2 so that the output of the comparator CMP1 has been inverted to the H level, the E1 detection circuit 13 is arranged not to operate as long as the wiring line is normal. Accordingly, the output of the comparator CMP2 maintains an L level. Therefore, the output of the AND circuit AND2 does not become the H level.

Now, in a case where a short-circuit fault such as dead short-circuit has occurred in the load connection wiring line connecting the point P3 and the load 11, that is the load connection wiring line has been grounded by a path consisting of a resistance Rw3 and an inductance L3, the counter-electromotive force E1 is generated in the common wiring line due to this short-circuit fault. In addition, the voltage V1 of the point P1 is suddenly decreased by the generation of the counter-electromotive force E1. On this occasion, the voltage V4 of the point P4 cannot be suddenly decreased due to the existence of a time constant. Therefore, the voltage V1 becomes lower than the voltage V4 of the point P4. As a result, the output signal of the comparator CMP2 is inverted from the L level to the H level. That is, in the case where the counter-electromotive force E1 (first counter-electromotive force) has exceeded the predetermined threshold value, the output signal of the comparator CMP2 becomes the H level. This signal of the H level is fed to one input terminal of the AND circuit AND2 in each of the load circuits.

Besides, a counter-electromotive force is generated also in the wiring line (load connection wiring line) which connects the point P1, the MOSFET (T1), the load 11 and the ground. Here, the counter-electromotive force E2 which is generated in a direction from the point P3 toward the point P2 is indicated by the following formula (1) in a case where the inductance between the points P2 and P3 is denoted by Lx, and a load current by ID:

$$E2 = Lx * (dID/dt) \quad (1)$$

When the counter-electromotive force E2 is generated, a current I1 flowing through the resistance R3 is controlled by the amplifier AMP1 and the MOSFET (T2) so that the counter-electromotive force E2 may become equal to a voltage which is generated across the resistance R3. Accordingly, the voltage V5 that is generated at the point P5 becomes a voltage that is (R4/R3) times the counter-electromotive force E1. In the example shown in FIG. 1, R3=5 [kΩ] and R4=120 [kΩ] are set, and hence, the voltage V5 appearing at the point P5 becomes a voltage which is 24 times the counter-electromotive force E1.

In addition, the voltage V5 of the point P5 and the decision voltage V6 are compared in the comparator CMP1, and the output signal of the comparator CMP1 is inverted from the L level to the H level in a case where the voltage V5 has become higher than the decision voltage V6. That is, in the case where the counter-electromotive force E2 has been generated due to the short-circuit fault and where the voltage V5 obtained by multiplying the counter-electromotive force E2 has become higher than the decision voltage V6, the output signal of the comparator CMP1 becomes the H level. On this occasion, owing to the generation of the counter-electromotive force E1, the decision voltage V6 has been decreased. Therefore, the voltage V5 becomes easy to exceed the decision voltage V6. In turn, the output signal of the comparator CMP1 becomes easy to be inverted.

Here, in the E2 detection circuit 12, it suffices that whether or not the counter-electromotive force E2 being in a same direction as the counter-electromotive force E1 has been generated can be detected. Therefore, the decision voltage V6 may be a plus value. In actuality, however, in order to avoid any maloperation ascribable to noise or the like, the decision voltage V6 is determined so that, in a case where the counter-electromotive force E2 caused by the inductance Lx has become higher than 20 [mV], V5>V6 may hold true (in other words, the output signal of the comparator CMP1 may be inverted).

In addition, when the signals of the H level are fed to the two input terminals of the AND circuit AND2, the output of the AND circuit AND2 is inverted from the L level to the H level, and the signal of the H level is fed to the latch DF1. The −Q output of the latch DF1 becomes the L level, and the +Q output thereof the H level. Therefore, the output signal of the AND circuit AND1 becomes the L level, and the drive of the MOSFET (T1) is stopped. Further, the MOSFET (T3) is turned ON, and the gate of the MOSFET (T1) is grounded. Accordingly, the MOSFET (T1) has its turn-OFF state maintained until the latch DF1 is reset.

In this case, the counter-electromotive force E2 being in same direction to the counter-electromotive force E1 is generated in only the load circuit in which the short-circuit fault has occurred. Therefore, the other load circuit in which the counter-electromotive force E2 being in same direction to the counter-electromotive force E1 is not generated is not cut off, and it can maintain its drive state.

In this way, in the protective device for the load circuit according to the first embodiment, in the case where the short-circuit fault such as the dead short-circuit has occurred in any of the plurality of load circuits disposed, the counter-electromotive force E1 (the first counter-electromotive force) is generated in the common wiring line (the wiring line between the point P1 and the power source VB) which is common to the plurality of load circuits. Therefore, this counter-electromotive force E1 is detected by the E1 detection circuit 13. Besides, in the load circuit in which the short-circuit fault has occurred, the counter-electromotive force E2 is generated in the sense of the arrow in FIG. 1 (that is, in the same direction as that of the counter-electromotive force E1), in the load connection wiring line (the wiring line between the points P2 and P3). Therefore, this counter-electromotive force E2 is detected by the E2 detection circuit 12.

In addition, in a case where the counter-electromotive force E1 has been generated, and besides, where the counter-electromotive force E2 has been generated in the same sense as that of the counter-electromotive force E1, the MOSFET (T1) is turned OFF, thereby to protect the load 11. Accordingly, in the case where the short-circuit fault has occurred in the load circuit, this load circuit can be instantly cut off, and the other load circuits in which any short-circuit fault has not occurred can be continuously operated.

By the way, in the first embodiment stated above, the partial section (between P2 and P3) on the source side of the MOSFET (T1), in the wiring line between the MOSFET (T1) and the load 11, has been set as the section for detecting the counter-electromotive force E2. However, the present invention is not restricted to this section, but a partial section in a wiring line laid between the point P1 and the ground can be set as the section for detecting the counter-electromotive force E2. Besides, in the first embodiment stated above, there has been described the example in which the voltage V5 obtained by amplifying the counter-electromotive force E2 is generated using the resistances R3 and R4, but it is also possible to employ a configuration in which the same voltage as the counter-electromotive force E2 is generated without amplifying this counter-electromotive force, so as to be compared with the decision voltage.

Modification to First Embodiment

Figure 2:
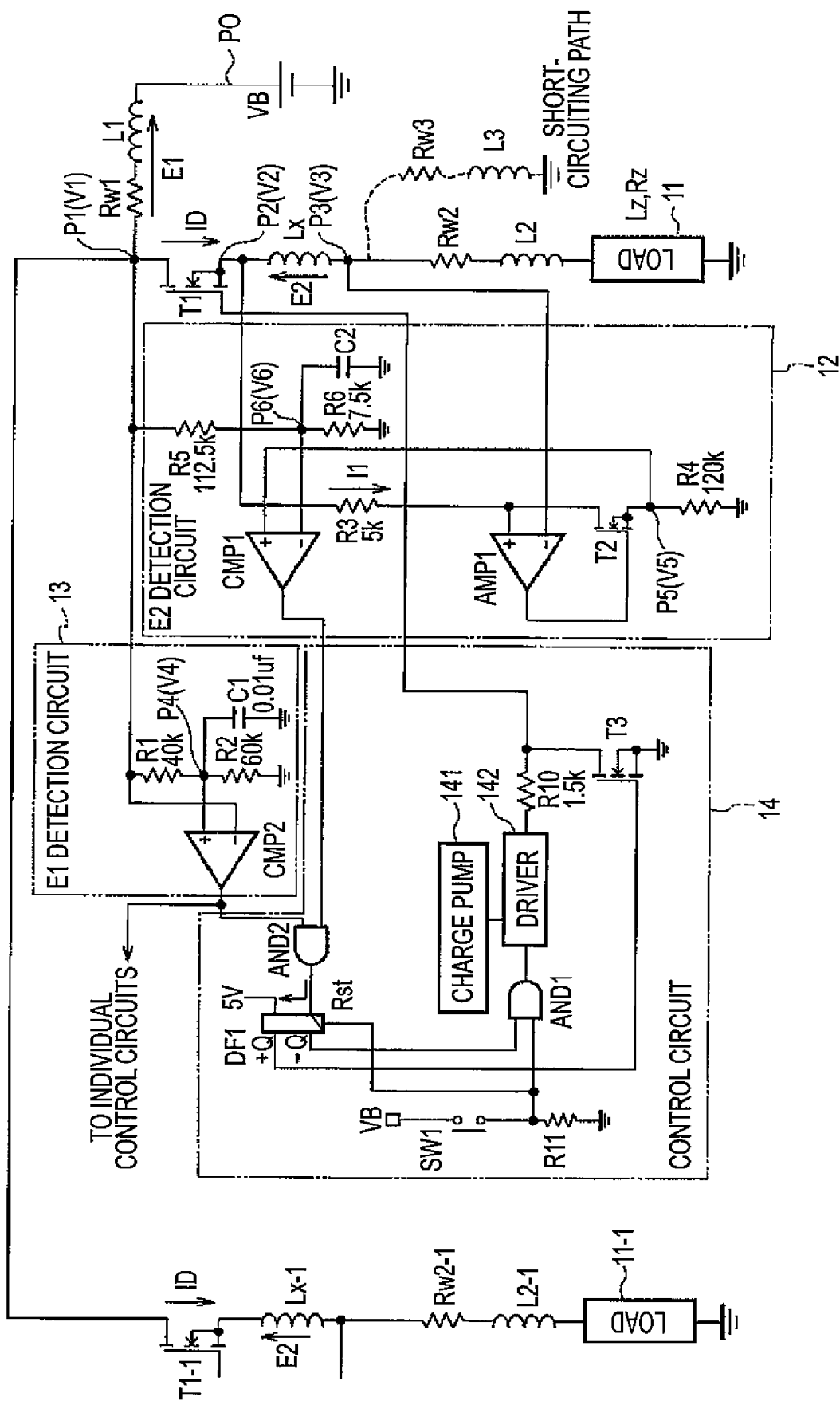
FIG. 2 is a circuit diagram showing the configuration of a protective device for a load circuit according to a modification to the first embodiment of the present invention.

Next, there will be described a modification to the protective device for the load circuit according to the first embodiment stated above. FIG. 2 is a circuit diagram showing the configuration of a protective device for the load circuit according to the modification. The circuit shown in FIG. 2 differs from the circuit shown in FIG. 1, in the point that a capacitor C2 is interposed between the point P6 of the E2 detection circuit 12 and the ground. In addition, owing to the inclusion of the capacitor C2, the voltage V6 of the point P6 changes with a time constant, and even in a case where the voltage V1 of the point P1 has been decreased at the occurrence of the short-circuit fault such as the dead short-circuit, the decision voltage V6 can be held at a substantially constant value.

In addition, owing to such a configuration, the decision voltage can be made stabler as compared with that in the first embodiment stated before, though the inversion timing of the output signal of the comparator CMP1 becomes somewhat later. Therefore, the occurrence of any maloperation ascribable to noise or the like can be lessened still further.

Second Embodiment

Figure 3:
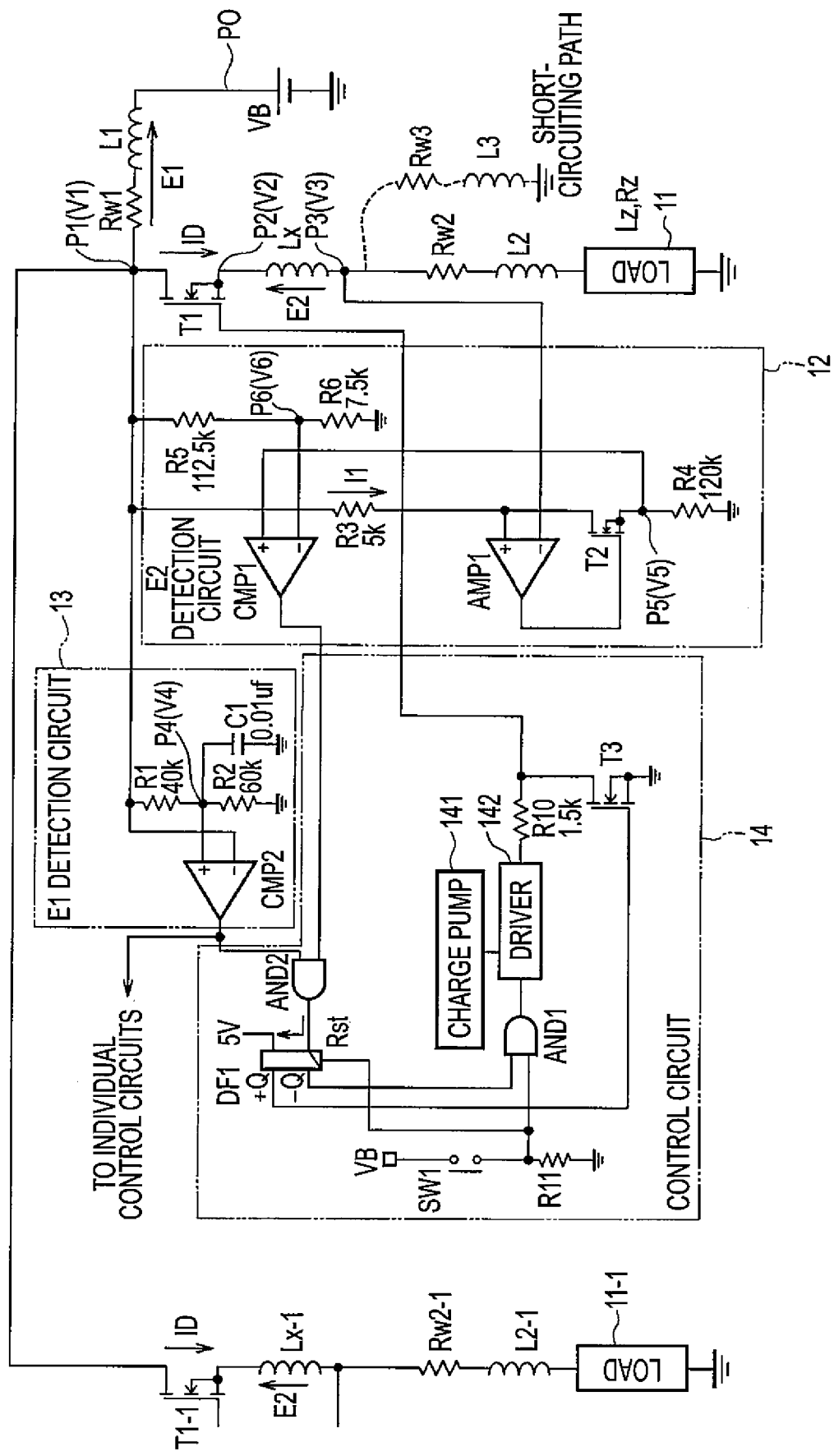
FIG. 3 is a circuit diagram showing the configuration of a protective device for a load circuit according to the second embodiment of the present invention.

Next, the second embodiment of the present invention will be described. FIG. 3 is a circuit diagram showing the configuration of a protective device for a load circuit according to the second embodiment. When compared with the circuit shown in FIG. 1 as stated before, the circuit shown in FIG. 3 differs in the point that one end of the resistance R3 disposed in the E2 detection circuit 12 is connected to the point P1. More specifically, in FIG. 1 referred to in the first embodiment, one end of the resistance R3 has been connected to the source of the MOSFET (T1), but in FIG. 3 concerning the second embodiment, it is connected to the point P1. Besides, an inductance Lx shown between the points P2 and P3 in FIG. 3 indicates the whole inductance between the points P1 and P3. That is, the inductance Lx contains an inductance component that the MOSFET (T1) has. Since the remaining configuration is the same as in FIG. 1, the description of a detailed configuration shall be omitted.

The operation of the protective device for the load circuit according to the second embodiment will be described below. The amplifier AMP1 and the MOSFET (T2) shown in FIG. 3 control a current I1 to flow through the resistance R3, so that a voltage which is generated across the resistance R3 may become equal to a voltage (denoted by "Va") which is generated between the points P1 and P3. Here, the voltage Va becomes the total voltage of the drain–source voltage Vds of the MOSFET (T1) and the counter-electromotive force E2 induced by the inductance Lx. Accordingly, the voltage Va can be indicated by the following formula (2):

$$Va = E2 + Vds = Lx*(dID/dt) + Ron*ID \quad (2)$$

where "Ron" denotes the ON-resistance of the MOSFET (T1), and "ID" denotes a load current.

In addition, in the second embodiment, in a case where a short-circuit fault has occurred in any load circuit, the counter-electromotive force E1 is generated in the common wiring line which connects the point P1 and the power source VB, and the output signal of the comparator CMP2 becomes the H level in the same manner as in the first embodiment stated before.

Besides, in the load circuit in which the short-circuit fault has occurred, the total (=Va) of the counter-electromotive force E2, which is caused by the inductance Lx and the terminal voltage Vds of the MOSFET (T1), which is enlarged by the increase of the load current ID, rises to raise the voltage V5 of the point P5. As a result, the voltage V5 becomes higher than the decision voltage V6, so that the output signal of the comparator CMP1 is inverted to the H level. That is, in a case where a voltage drop in the section between the points P1 and P3 has exceeded the predetermined decision value, the output signal of the comparator CMP1 becomes the H level.

As a result, both the signals fed to the two input terminals of the AND circuit AND2 become the H level, and the gate of the MOSFET (T1) is grounded by the latch DF1, thereby to turn OFF this MOSFET (T1). Thus, the load circuit in which the short-circuit fault has occurred can be protected, and the other load circuit in which any short-circuit fault has not occurred can be continuously operated.

In this way, in the protective device for the load circuit according to the second embodiment, in the case where the short-circuit fault such as the dead short-circuit has occurred in any of the plurality of load circuits disposed, the counter-electromotive force E1 (the first counter-electromotive force) is generated in the common wiring line (the wiring line between the point P1 and the power source VB) which is common to the plurality of load circuits. Therefore, this counter-electromotive force E1 is detected by the E1 detection circuit 13. Besides, in the load circuit in which the short-circuit fault has occurred, the counter-electromotive force E2 is generated in the sense of the arrow in FIG. 3 (that is, in the same sense as that of the counter-electromotive force E1), in the wiring line between the points P1 and P3 (the load connection wiring line), and the voltage Vds which is generated across the MOSFET (T1) rises. Therefore, the total voltage Va (=E2+Vds) of these voltages rises, and it is detected by the E2 detection circuit 12 that the voltage V5 generated at the point P5 becomes higher than the decision voltage V6. As a result, the latch DF1 is operated to turn OFF the MOSFET (T1) and to protect the load 11. Accordingly, in the case where the short-circuit fault has occurred in the load circuit, the load circuit can be instantly cut off, and the other load circuit in which any short-circuit fault has not occurred can be continuously operated.

Here, in the second embodiment, the E2 detection circuit 12 detects the voltage Va obtained by adding the counter-electromotive force E2 and the terminal voltage Vds of the MOSFET (T1) and amplifies this voltage Va, thereby to generate the voltage V5. It detects the occurrence of the short-circuit fault in the case where the voltage V5 has become higher than the decision voltage V6. In the second embodiment, accordingly, the decision voltage V6 needs to be set at a voltage which is larger than a voltage obtained in such a way that the product (Ron*ID) between the load current ID at the time when the wiring line is normal (when the short-circuit fault has not occurred) and the ON-resistance Ron of the MOSFET (T1) is multiplied by a resistance ratio (R4/R3).

For this reason, a time period longer than in the first embodiment stated before is expended in specifying the load circuit in which the short-circuit fault such as the dead short-circuit has occurred. On the other hand, however, even in case of the generation of an overcurrent having a gentle increasing gradient in which the counter-electromotive force E1 or E2 does not exceed the decision voltage V4 or V6, the protective device for the load circuit as illustrated in the second embodiment becomes capable of detecting the generation of the overcurrent.

Figure 4:
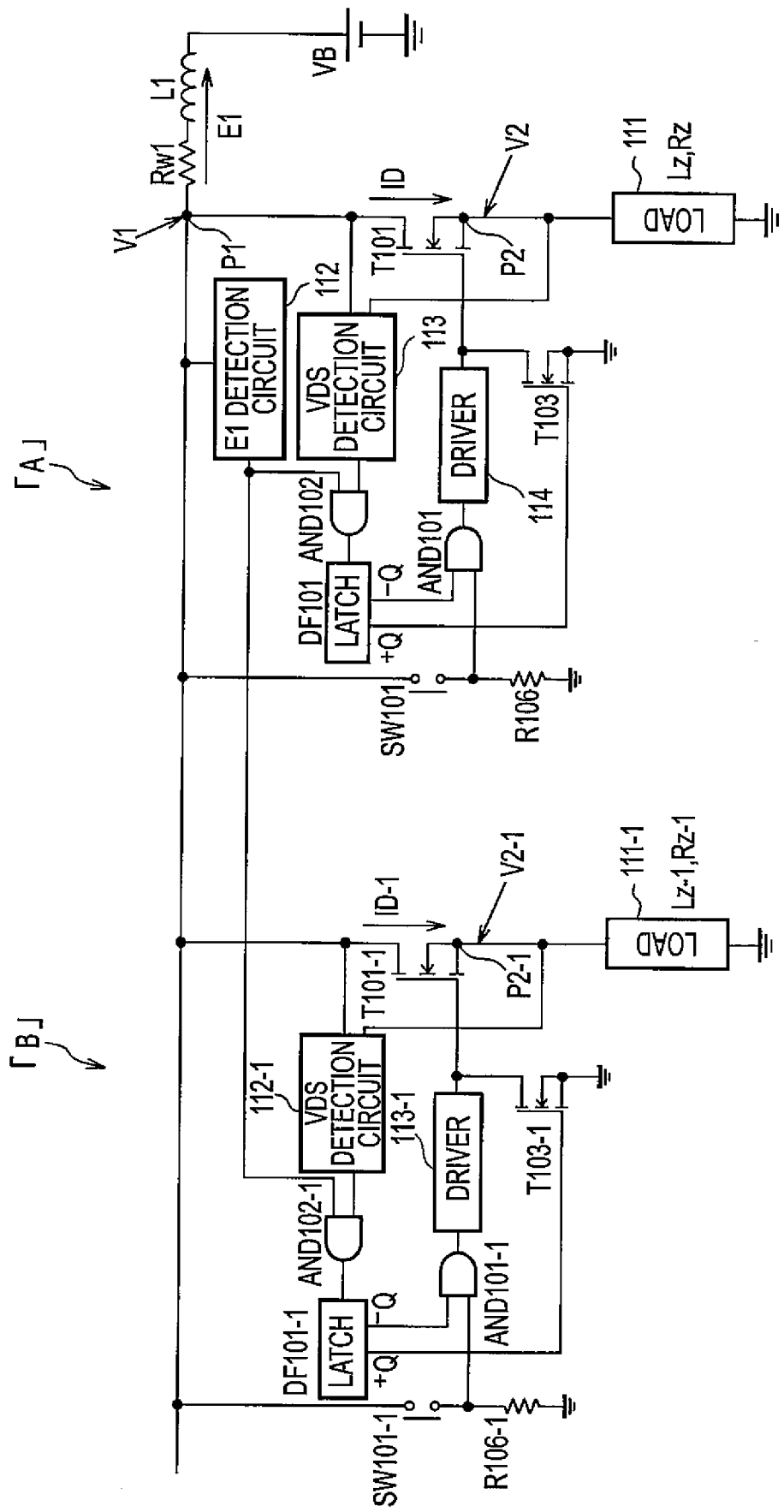
FIG. 4 is a circuit diagram showing the configuration of a protective device for a load circuit in the prior art.

Besides, the circuit shown in FIG. 4 as explained in the prior art has the configuration in which the load circuit having undergone the short-circuit fault is specified using only the magnitude of the overcurrent, whereas in the second embodiment, the load circuit having undergone the short-circuit fault is specified using the voltage Va (=Vds+E2) in which the voltage (E2) proportional to the increase gradient of the overcurrent is added to the voltage Vds (=Ron*ID) proportional to the magnitude of the overcurrent. Therefore, the time period which is expended on the specification of the load circuit having undergone the short-circuit fault is shortened. The amount of the shortening enlarges more as the increase gradient of the short-circuit current is larger, that is, as the degree of the dead short-circuit is higher. In this manner, in the protective device for the load circuit according to the second embodiment, the time period which is expended on the specification of the load circuit having undergone the short-circuit fault can be made much shorter than in the prior art.

Although the protective device for the load circuit in the present invention has thus far been described in conjunction with the illustrated embodiments, the present invention is not restricted to the embodiments, but the configurations of the individual parts can be replaced with desired configurations having similar functions.

INDUSTRIAL APPLICABILITY

The present invention is very useful for rapidly cutting off only a load circuit in which a short circuit has occurred, thereby to protect the load circuit, in a case where the short-circuit has occurred in the load circuit.

DESCRIPTION OF REFERENCE NUMERALS AND SIGNS

11 Load
12 E2 detection circuit (Second counter-electromotive force detection unit)
13 E1 detection circuit (First counter-electromotive force detection unit)
14 Control circuit (Cutoff control unit)
141 Charge pump
142 Driver
T1 MOSFET (Semiconductor switch)
VB Power source

The invention claimed is:

1. A protective device for a load circuit, in which a plurality of load circuits in each of which a semiconductor switch and a load are connected through a load connection wiring line are connected in parallel, each of the load circuits and a power source are connected through a common wiring line that is common to each of the load circuits, and when an overcurrent has been generated in at least one of the load circuits, the load circuit having undergone the over-current is cut off, the protective device comprising:

a first counter-electromotive force detection unit for detecting a first counter-electromotive force which appears in the common wiring line, and second counter-electromotive force detection unit disposed in at least one of the load circuits, and for detecting whether or not a second counter-electromotive force which is the same direction as the first counter-electromotive force is induced in the load connection wiring line; and a cutoff control unit for cutting off the load circuit which has the load connection wiring line, in a case where the first counter-electromotive force has exceeded a predetermined threshold value and where the second counter-electromotive force has been induced in the load connection wiring line.

2. The protective device for a load circuit as defined in claim 1, wherein the load connection wiring line is a wiring line that is used between a branch point branching from the common wiring line to each individual load circuit and a ground point for grounding each individual load circuit; and said second counter-electromotive force detection unit detects a counter-electromotive force that is caused by an inductance component existent at part of the load connection wiring line.

3. A protective device for a load circuit, in which a plurality of load circuits in each of which a semiconductor switch and a load are connected through a load connection wiring line are connected in parallel, each of the individual load circuits and a power source are connected through a common wiring line that is common to each of the load circuits, and when an over-current has been generated in at least one of the load circuits, the load circuit having undergone the over-current is cut off; the protective device comprising:

a first counter-electromotive force detection unit for detecting a first counter-electromotive force which appears in the common wiring line; and a cutoff control unit disposed in at least one of the load circuits, and for cutting off the load circuit which has the load connection wiring line, in a case where a section which consists of the semiconductor switch and a part of the load connection wiring line has been set, where a voltage drop which appears across the section has been measured, and where the first counter-electromotive force has exceeded a predetermined threshold value, while the voltage drop across the section has exceeded a predetermined decision value.

* * * * *